United States Patent
Feng et al.

(10) Patent No.: US 7,816,945 B2
(45) Date of Patent: Oct. 19, 2010

(54) 3D CHIP-STACK WITH FUSE-TYPE THROUGH SILICON VIA

(75) Inventors: Kai Di Feng, Hopewell Junction, NY (US); Louis Lu-Chen Hsu, Fishkill, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/357,664

(22) Filed: Jan. 22, 2009

(65) Prior Publication Data

US 2010/0182041 A1    Jul. 22, 2010

(51) Int. Cl.
*H03K 19/173* (2006.01)
(52) U.S. Cl. .......................................... 326/38; 327/525
(58) Field of Classification Search ............... 326/37–41
See application file for complete search history.

(56) References Cited

U.S. PATENT DOCUMENTS

| 6,168,969 | B1 | 1/2001 | Farnworth |
| 6,400,008 | B1 * | 6/2002 | Farnworth ................... 257/698 |
| 7,122,898 | B1 | 10/2006 | Yang et al. |
| 7,317,256 | B2 | 1/2008 | Williams et al. |
| 2001/0045645 | A1 | 11/2001 | Sasaki et al. |
| 2008/0073747 | A1 | 3/2008 | Chao et al. |
| 2008/0079121 | A1 | 4/2008 | Han |

FOREIGN PATENT DOCUMENTS

WO    2009/005462 A1    8/2009

OTHER PUBLICATIONS

International Application No. PCT/EP2009/065814, PCT/ISA/220 Notification of Transmittal of The International Search Report and The Written Opinion of the International Searching Authority, or the Declaration dated Apr. 3, 2010.

* cited by examiner

*Primary Examiner*—Don P Le
(74) *Attorney, Agent, or Firm*—John A Jordan; Katherine S. Brown

(57) ABSTRACT

Programmable fuse-type through silicon vias (TSVs) in silicon chips are provided with non-programmable TSVs in the same chip. The programmable fuse-type TSVs may employ a region within the TSV structure having sidewall spacers that restrict the cross-sectional conductive path of the TSV adjacent a chip surface contact pad. Application of sufficient current by programming circuitry causes electromigration of metal to create a void in the contact pad and, thus, an open circuit. Programming may be carried out by complementary circuitry on two adjacent chips in a multi-story chip stack.

8 Claims, 15 Drawing Sheets

3D CHIP-STACK WITH FUSE-TYPE THROUGH SILICON VIA

BACKGROUND OF THE INVENTION

1. Field of the Invention

The present invention relates to a 3D chip stack with fuse-type through silicon via (TSV) structures and, more particularly, to a 3D chip stack with programmable fuse-type TSV structures used to carry electrical signals vertically through semiconductor die.

2. Background and Related Art

In the packaging of electronic devices, such as, semiconductor chips and wafers, or semiconductor chip carriers, vertical interconnection to the next packaging level, whether it be to a chip carrier or stacked chip, may be achieved by through silicon vias (TSVs). Various techniques are known to create TSVs. Stacking chips is a multi-story chip structure, sometimes referred to as a 3D chip stack, allows for reduced signal transmission distance from die to die and enables a large increase in the number of links that may be established between dies.

Such small-sized packages, as provided by 3D chip stacks using TSV structures, are in high demand for a variety applications, such as, cell pone, digital cameras, PDAs, GPSs, laptop computers, and the like. The continuation growth of these applications requires on-going efforts to boost performance, broaden functionalities, reduce cost and increase packaging densities.

One of the difficulties with such structures is that when the 3D stack is assembled, the interconnects between chips are formed by prefabricated TSVs. As a result, it is not possible to alter the status of these TSVs, once assembled. However, for purposes of repairing, programming, altering status and rerouting, it is desirable to have the capability to open an originally shorted TSV line.

SUMMARY OF THE PRESENT INVENTION

In accordance with embodiments of the present invention, methods and apparatus act to provide a programmable arrangement that allows an originally closed or shorted TSV link between chips, for example, to be opened through program control circuitry.

Embodiments of the invention are generally directed to a programmable fuse-type TSV for a chip arrangement. Stacked chips with programmable fuse-type TSVs may be employed, and further arrangements are also provided wherein the programmable fuse-type TSVs may be programmed through control circuitry, as may exist in adjacent chips, for example, cooperatively acting together to selectively open TSVs in the chips. A chip may include both programmable fuse-type TSVs and permanent, i.e. non-programmable TSVs.

In an embodiment of the invention, an electronic package includes at least one chip having at least one programmable fuse-type TSV via structure for chip interconnection to other electronic structure.

In other aspects of the electronic package;

the programmable fuse-type TSV structure includes a region of reduced cross-section of conductive material in the via opening as formed within a portion of the via of said at least one TSV structure;

the programmable fuse-type TSV structure is programmed from a low impedance state to a high impedance state by control circuitry controlling the current flow through the reduced cross-section of conductive material in the via opening as formed within a portion of the via of the at least one TSV structure;

the current flow is controlled by control circuitry formed in each of at least two chips stacked one on another;

functional circuits in each of the at least two chips are decoupled by isolation circuits from the control circuitry during programming operation;

during programming operation the control circuitry in one of the at least two chips controls the current flow level into the reduced cross-section of conductive material in the via opening as formed within a portion of the via of the at least one TSV structure and senses when the fuse-type structure goes from the low impedance state to the high impedance state; and during programming operation, the control circuitry in the other of the at least two chips controls the current flow out of the reduced cross-section of conductive material in the via opening as formed within a portion of the via of the at least one TSV structure.

In another embodiment, an electronic package is provided including a plurality of stacked chips interconnected by TSVs at least some of which are programmable by fuse-type structure that provides one impedance value in an unprogrammed state and another impedance value in a programmed state in response to sufficient current flow through the fuse-type structure initiated by programming control circuitry arranged across adjacent chips.

In yet another embodiment, a method is provided for programming a programmable TSV interconnecting chips in a chip stack by:

providing at least one TSV having a region of reduced cross-section of conductive material;

supplying current into one end of the at least one TSV having a region of reduced cross-section of conductive material of sufficient level to cause a void in the conductive material to create a high impedance state;

controlling the current out of another end of the at least one TSV having a region of reduced cross-section of conductive material;

sensing when the at least one TSV is programmed into the high impedance state; and removing the current from the at least one TSV when programmed.

Other aspects of the method for programming a programmable TSV include:

the step of supplying current into one end of the at least one TSV is supplied through one chip of the chip stack and the step of controlling the current out of the another end of the at least one TSV is controlled through another chip of the chip stack; and the further step of isolating functional circuits in at least the one chip and another chip from the steps of supplying current into one end of the at least one TSV and controlling the current out of another end of the at least one TSV.

In a further embodiment, a method of making programmable TSVs in chips is provided by forming devices and circuits on a chip including control circuitry for programming at least one through silicon via in the chip, forming metallization and dielectric interconnecting the devices and circuits including metallization at the surface of the dielectric for interconnecting the control circuitry for programming the at least one TSV, forming conductive TSVs in the chip for vertically interconnecting the chip to other electronic apparatus, forming programmable material within the via of at least one of the conductive TSV including a region of reduced cross-section of conductive material of the conductive TSV to form a programmable TSV, and forming a conductive connection between the programmable material and the control circuitry for programming said programmable TSV.

Further aspect of the method of making programmable TSVs in chips include:

the programmable material including a region of reduced cross-section of conductive material is formed by providing via sidewall spacers of insulating material;

the sidewall spacers are formed by removing a portion of conductive material within the via of the at least one conductive via to form a recess at the active surface of the chip;

depositing a layer of insulating material in the recess;

directional dry etching the insulating material to form a restricted opening in the insulating material at the bottom region thereof;

the additional control circuitry is arranged to be complementary to additional control circuitry in another chip formed within the devices and circuits of the another chip;

an electrical connection is formed from the additional control circuitry in the another chip to a surface contact pad in the layer of metallurgy of the another chip;

the chip and the another chip are stacked one on another so that the surface contact pad of the another chip is electrically connected to the programmable TSV of the chip;

the restricted opening is filled with a conductive material to form the region of reduced cross-section of conductive material; and the conductive material extends beyond the opening over the surface of the dielectric to the metallization at the surface of the dielectric to form at least a portion of the conductive connection between the programmable material and the control circuitry for programming the programmable TSV.

DETAILED DESCRIPTION OF THE DRAWINGS

Figure 1:
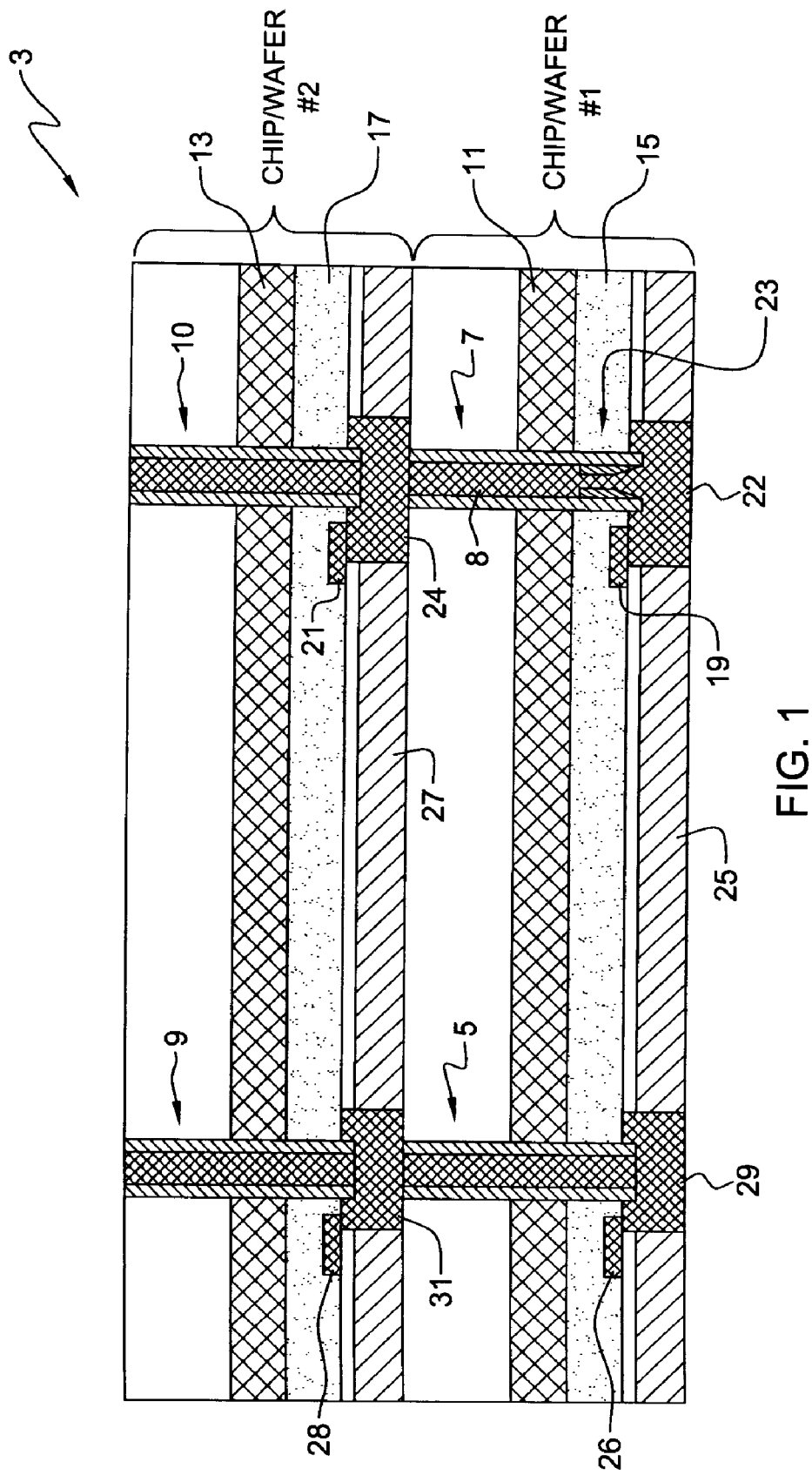
FIG. 1 shows a pair of stacked chips, one of which includes a programmable fuse-type TSV structure.

With reference to FIG. 1, there is shown an embodiment of a stacked chip structure 3. Although two chips are shown, it is clear that more than two chips may be stacked in the chip stack. In addition, it is clear that the arrangement could be at the wafer level. Both chips 1 and 2 include conductive through silicon vias (TSVs) with chip 1 having a non-programmable, i.e. conventional, TSV 5 and programmable fuse-type TSV 7. Chip 2 includes two non-programmable TSVs 9 and 10. It is clear that although the TSVs are designated through "silicon" vias, the vias may just as well exist in material other than silicon. It is also clear that additional TSVs may be included in the chips.

In general, such chips may be fabricated at the wafer level with standard devices and circuits formed in layers 11 and 13, respectively, of chips 1 and 2 using front end of line (FEOL) processes. Interconnects and dielectrics may then be formed in layers 15 and 17, respectively, of chips 1 and 2 using back end of line (BEOL) processes. Included in layers 15 and 17 are metal contacts 19 and 21 which connect to program control circuitry, to be explained in more detail hereinafter. For convenience, contacts 19 and 21 are only effectively shown as a portion of the circuits including devices, as formed in the FEOL layers 11 and 13 but not shown here. This programming control circuitry may be formed during FEOL processes and, as will be explained later, may be complementary in that one portion of the programming control circuitry may be in chip 1 and another portion of the programming control circuitry may be in chip 2. In addition to programming control circuitry, contacts 19 and 21 connect to chip functional circuitry formed during FEOL processes. Thus, contacts 19 and 21 act to interconnect both types of circuitry in the FEOL layers 11 and 13 to TSV metal contacts 22 and 24.

The programming control circuitry is designed to control the programming of programmable fuse-type TSV 7 by causing fuse structure 23 to go from a low impedance or closed state to a high impedance or open state. The programming control circuitry would typically be separate from the functional circuitry, i.e., the circuitry designed for chip operations, such as, logic, memory and the like. Contacts 26 and 28 in chips 1 and 2, respectively, interconnect functional circuitry in FEOL layers 11 and 13, to respective non-programmable TSVs 5 and 9.

Fuse-type structure 23 may be any of a variety of fuse-type structures. Among fuse-type structures that may be employed are those involving metallization-based, one-time programmable, electrical fuse structures positioned within a via with sidewall spacers to restrict the conductive cross-sectional area of the via conductor. Such an arrangement is represented by fuse-type structure 23 in FIG. 1.

Thus, as shown in FIG. 1, insulating layers 25 and 27 are formed on chips 1 and 2 with recesses arranged to allow contacts 22, 24, 29 and 31 to be formed to connect to the respective conductive TSVs 7, 10, 5 and 9. Fuse-type structure 23 is formed in a recess in TSV 7 to interconnect contact 22 and the conductive material 8 of TSV 7.

Figure 2:
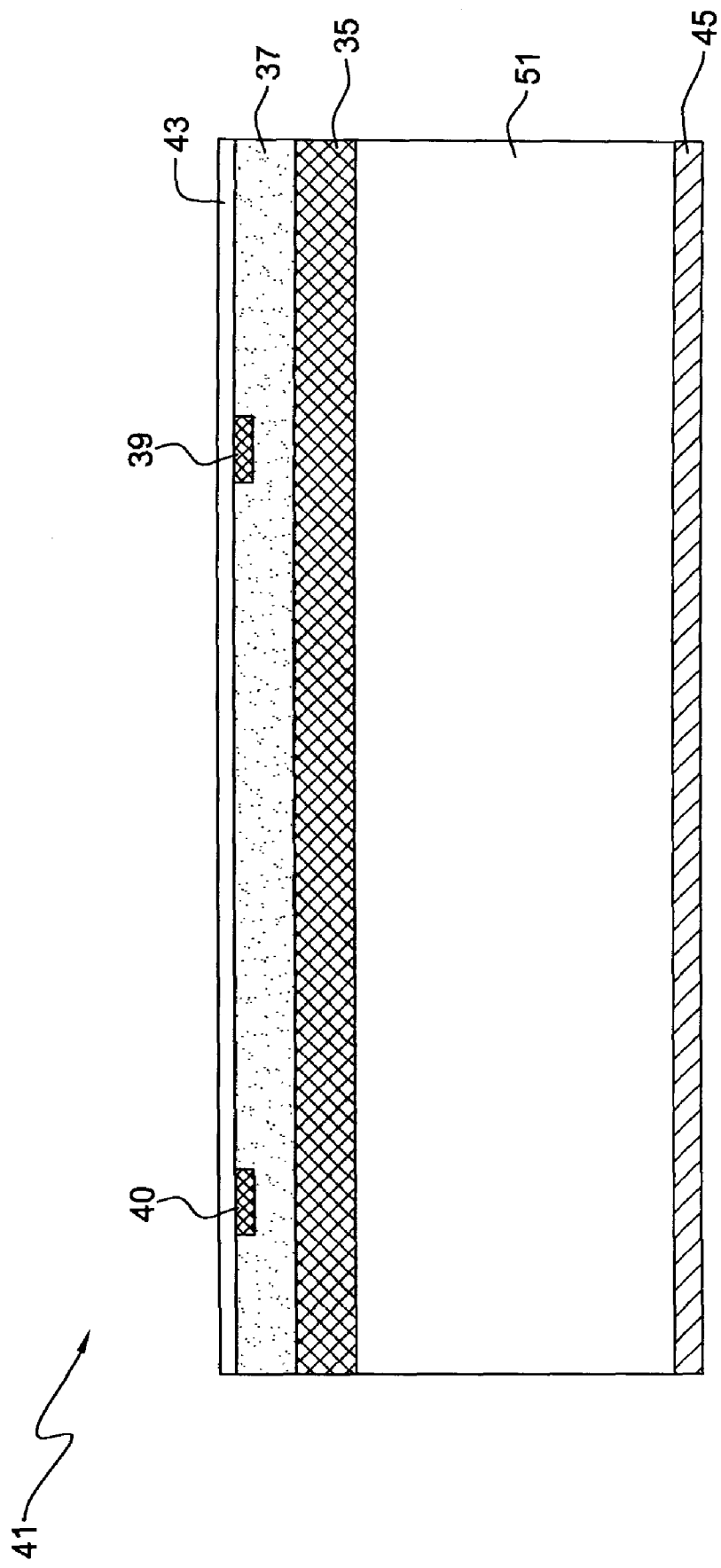
FIG. 2 shows a chip with a first layer including device and circuitry formed by front end of the line processing and a second layer including metallization formed at back end of the line processing.

With reference to FIG. 2, there is shown a chip structure 41 fabricated with layer 35 on silicon layer 51. Layer 35 includes device and circuit structures, as fabricated by any of a variety of FEOL processes. Layer 37, formed on layer 35, includes the metal interconnects and dielectric layers fabricated by any of a variety of BEOL processes.

In addition to the functional circuitry formed for chip performance, programming control and sensing circuitry, as well as power sources, may also be fabricated in layer 35 for controlling the programming of the programmable fuse-type TSVs. Interconnects for this control circuitry are, similarly, formed in layer 37 with metal on one or both contacts 39 and 40 connected to the programming control circuitry of this chip. The metal controls 39 and 40 also connected to chip functional circuitry. Upper protective layer 43 and lower protective layer 45 are formed on the chip structure.

Although description is made herein of fabricating at the chip level, it is understood that the processes employed to make the various chip structures may be carried out at the wafer level. Typically, the wafer would be diced into chips after wafer thinning, as described, for example, with reference to FIG. 9.

Figure 3:
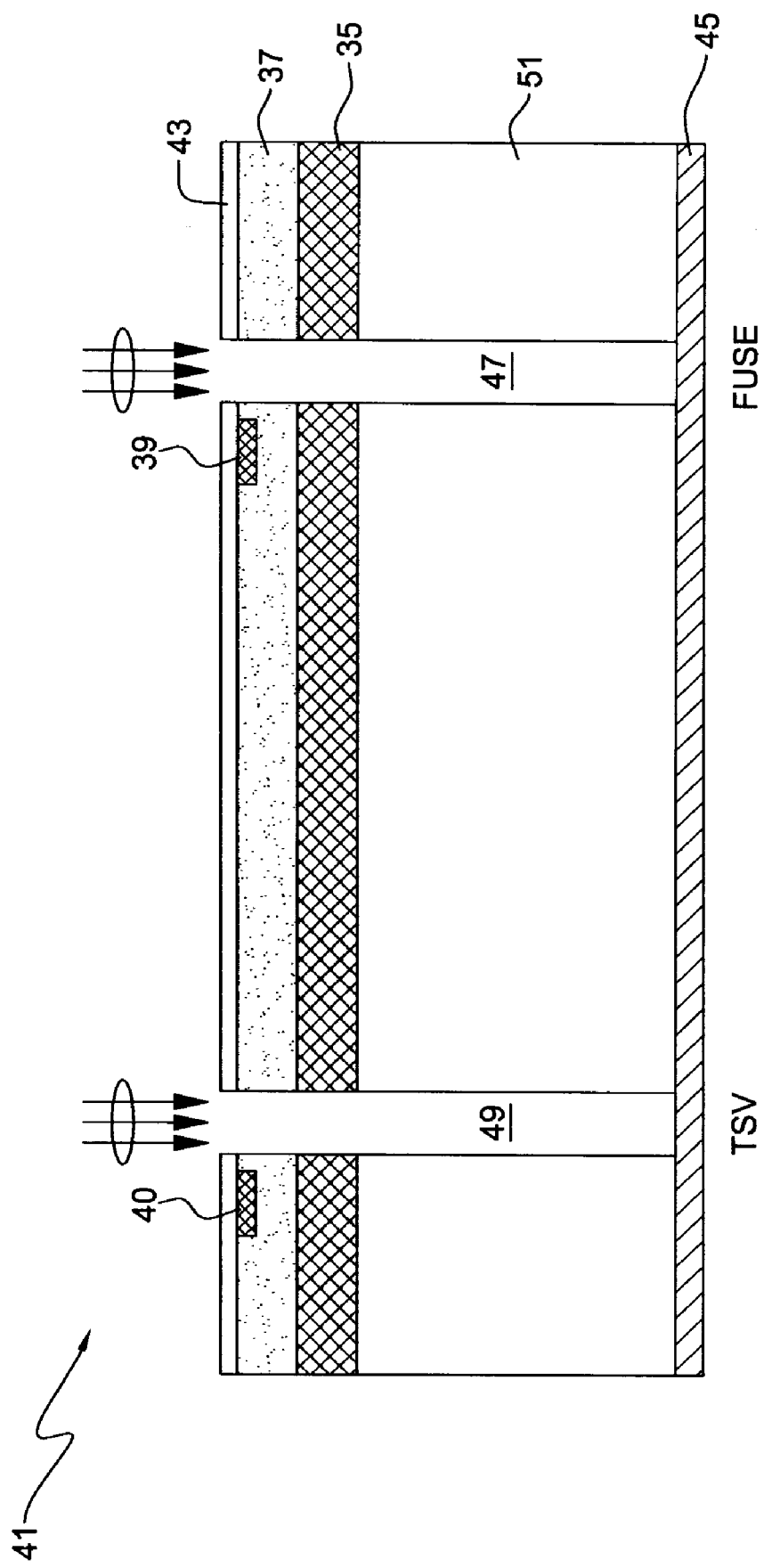
FIG. 3 shows vias formed in the chip of FIG. 2.

Protective layers 43 and 45 may be any of a variety of protective materials, such as, an oxide or nitride layer or both, formed by conventional deposition processes. With reference to FIG. 3, a photoresist mask (not shown), for example, is then used to allow TSV 47 and 49 openings to be etched in upper protective layer 43, BEOL layer 37, FEOL layer 35 and silicon layer 51.

TSVs 47 and 49 openings may be round shape, for example, and 1 to 100 µm in diameter and 20 to 200 µm in depth. A deep reactive ion etch (RIE) method, for example, may be used here to form TSV 47 and 49 openings. Thus, deep silicon etching by fluorine radicals generated in a plasma, as is known in the art, may be employed. As shown in FIG. 3, etching is terminated at protective layer 45 which acts as an etch stop. However, it is clear that etching may be terminated at other selected points in silicon layer 51 and, as will be explained later, backside grinding of the silicon body used to reveal TSVs 47 and 49 openings.

Figure 4:
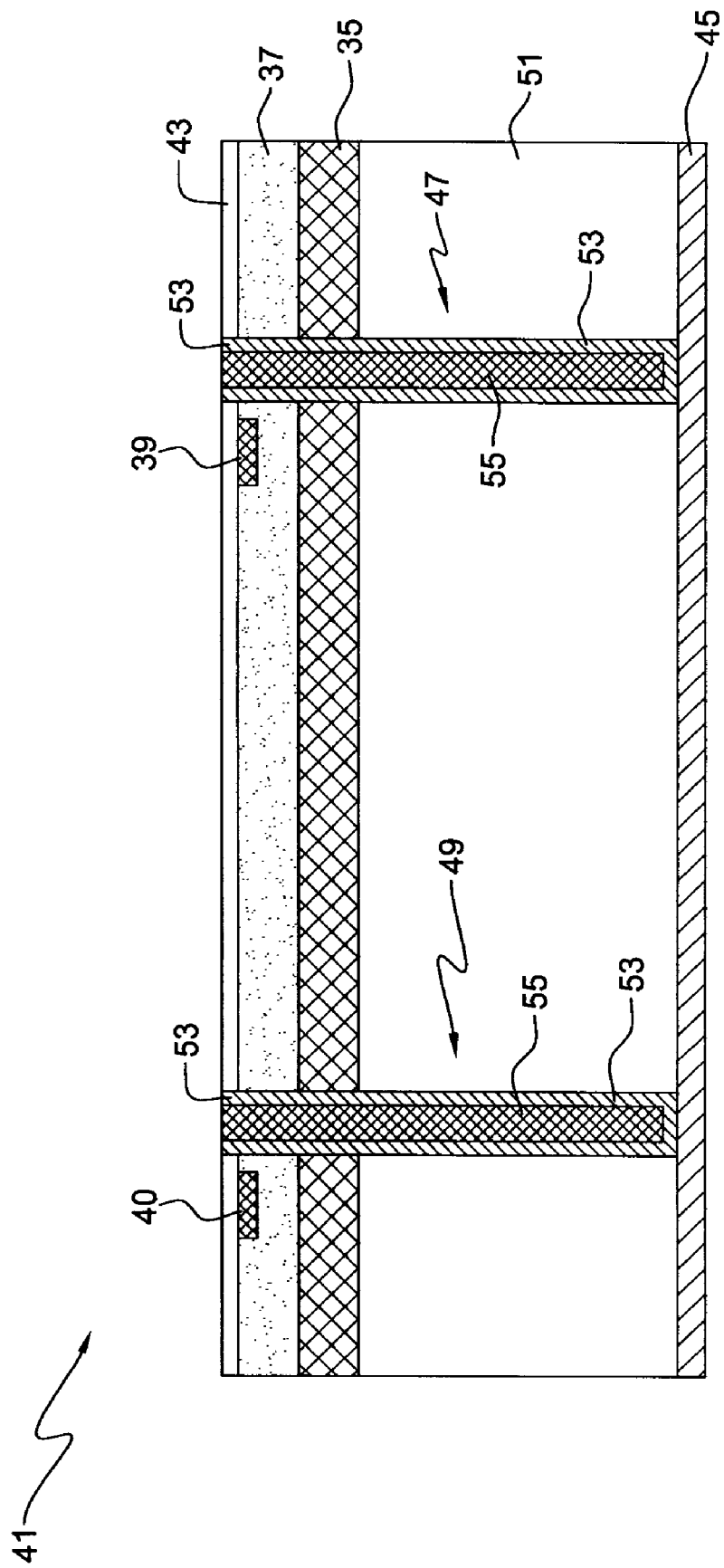
FIG. 4 shows the chip structure of FIG. 3 with a conformal layer of insulating material and vias filled with a conductive material to form conductive TSVs.

After forming the TSV 47 and 49 openings, a conformal layer of insulating material is deposited on chip structure 41 so as to coat the chip surface and sidewall surfaces and bottom wall surface of TSV 47 and 49 openings. The conformal layer of insulating material may be etched back to remove the material from the surface of protective layer 43 leaving the layer of insulating material as an insulating liner 53 on the side walls and bottom wall surface of TSV 47 and 49 openings. Alternatively, the layer of insulating material may be removed from the surface of protective layer 43 with the next metallization step. This is shown in FIG. 4. The liner 53 of insulating material may be any of an oxide, nitride, TEOS, PSG, and the like. The conformal layer is deposited so that the thickness of the insulating film along the via or trench sidewalls is sufficiently uniform. The coating may be carried out using a variety of known deposition techniques, such as, chemical vapor deposition (CVD) with CVD typically giving good conformality.

As further shown in FIG. 4, after forming liner 53 of insulating material, a layer of metal, such as, Al, Cu, W or Al doped with Cu, is deposited on chip structure 41 so as to fill the etched TSV 47 and 49 openings. The filling is carried out so as to not leave voids in the TSV openings. There are a variety of known deposition techniques for forming the metal on the chip structure so as to uniformly fill the vias, including CVD and electroplating, for example.

After depositing the layer of metal on chip structure 41 so as to fill the TSV 47 and 49 openings, excessive metallic and insulating material (where left on) may be removed from the top of chip structure 41 down to protective layer 43. This may be done using a chemical-mechanical polishing (CMP) process which is stopped at the upper surface of protective layer 43, the latter of which acts as a CMP etch stop layer. Thus, both layer of metal and layer of insulating material may be removed from the top surface of chip structure 41 leaving the metal filled TSVs 47 and 49 forming conductors 55 exposed at the surface.

Figure 5:
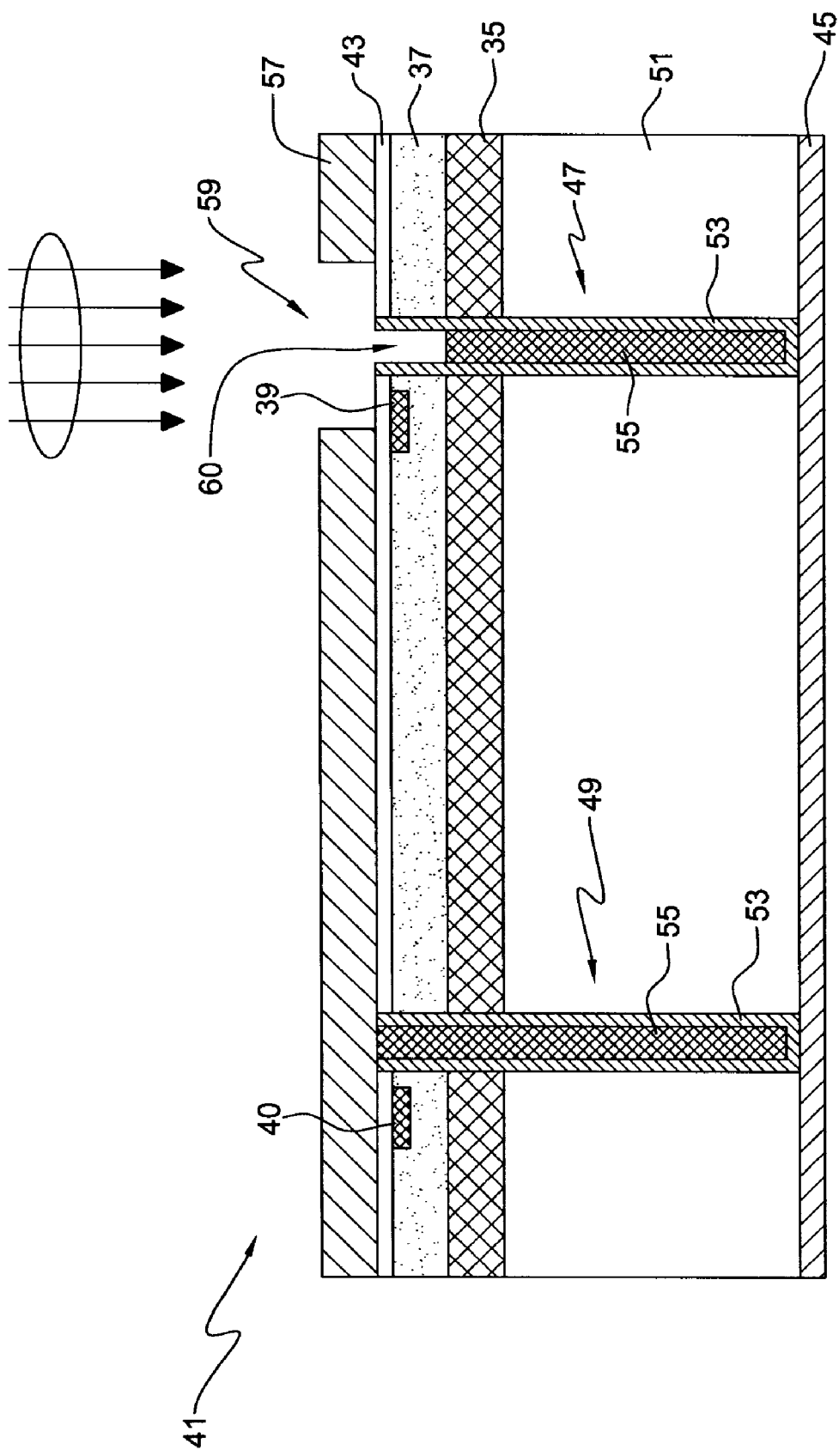
FIG. 5 shows the chip structure of FIG. 4 with a portion of a TSV etched back to form a recess in the TSV structure.

As shown in FIG. 5, a layer of resist or contacting mask 57 is then formed on the top surface of chip structure 41. The mask may be a photo resist mask patterned to form an opening 59 over TSV 47. The opening may extend beyond the width of filled TSV 47, as shown, or be coextensive with the cross-section opening of the TSV.

An RIE process may then be used to etch back conductor 55 in metal filled TSV 47 to form recess 60 in TSV 47, as shown in FIG. 5. The etch process is controlled by timing in order to form a recess 60 with 1 to 10 µm in depth. Although not shown, the etch process may remove some of the sidewall dielectric formed by the deposition of conformal layer 53 of insulating material, in addition to all of the insulating material from BEOL layer 37. It should be noted, that the etch process may also be conducted in several steps, in-situ, without breaking vacuum. Since there are several different material layers to be removed, including metal, conformation layer, dielectrics, etc., each material layer may then be etched in a separate step. After etching, resist layer 57 is removed.

Figure 6:
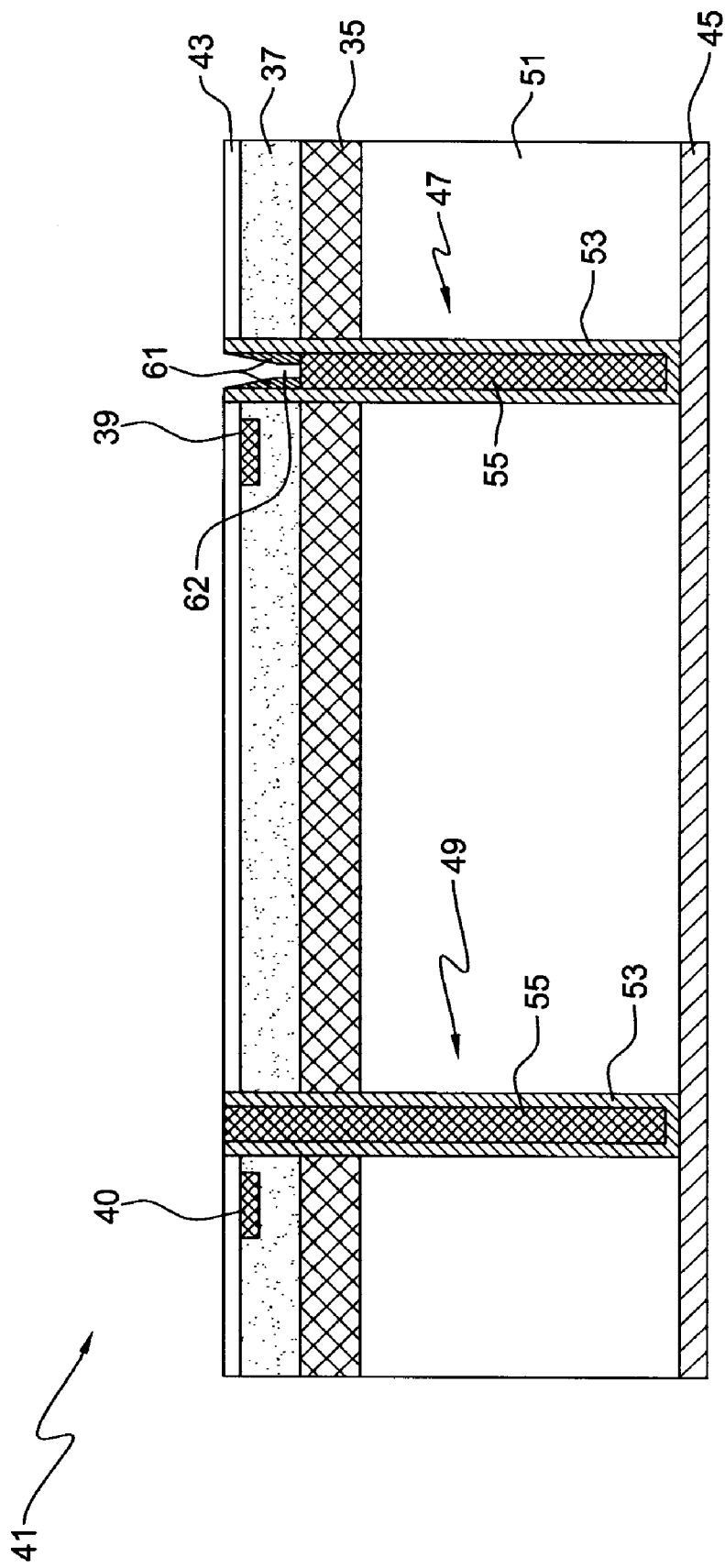
FIG. 6 shows the chip structure of FIG. 5 with sidewall spacers formed in the recess.
Figure 7:
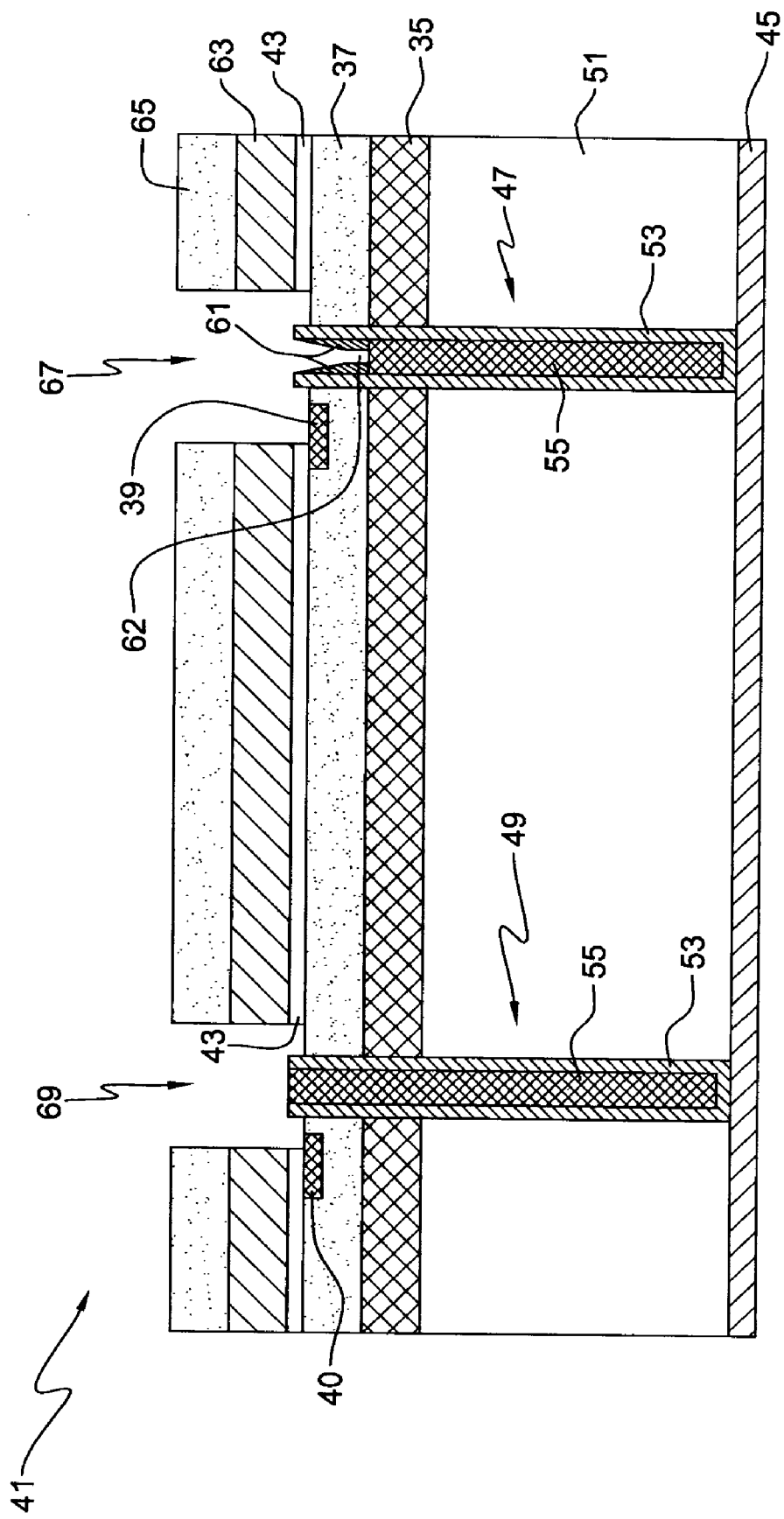
FIG. 7 shows the chip structure of FIG. 6 with openings formed in dielectric aligned with the TSVs.

FIGS. 6 and 7 show a process that may be used to form a TSV fuse-type structure, as shown in FIG. 1, for example. However, any of a variety of fuse-type structures may be used for this purpose. To form such structure, as shown in FIG. 6, a blanket layer of insulating material is deposited on chip structure 41 so as to cover the surface of protective layer 43 and conformally deposit within recess 60. This material could be $Si_3N_4$ or $SiO_2$, for example. Directional dry etching, such as physical sputtering, may then be used to remove the insulating layer from the surface of protective layer 43 and the bottom of recess 60, leaving tapered sidewall spacers 61 on the walls of the recess. Where the via opening is round, for example, the spacer will be round.

Figure 11:
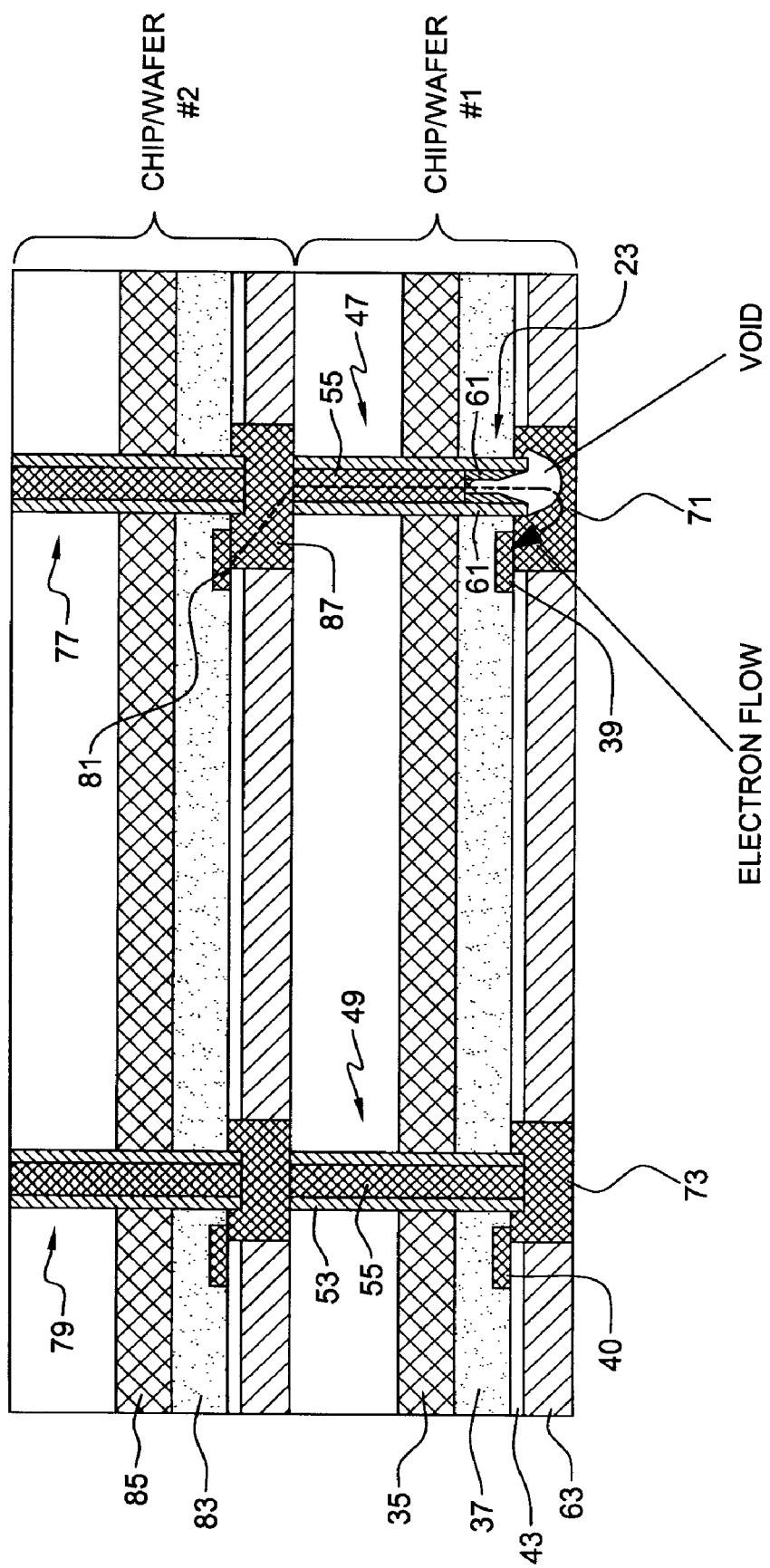
FIG. 11 shows how the fuse-type structure operates.

The spacer or spacers thus formed act to restrict or reduce the cross-sectional area of the via opening. This narrowed opening 62, also called the neck region, acts, in turn, to restrict or reduce the cross-section of metal that can fill the via 47. During programming current crowding effect will take place in the neck region and cause metallic material to move with electron wind, resulting in a void or opening. Depending on electron flow direction, the void can occur in different regions near the neck as illustrated in FIG. 11. The goal is to open the connection after programming.

Figure 8:
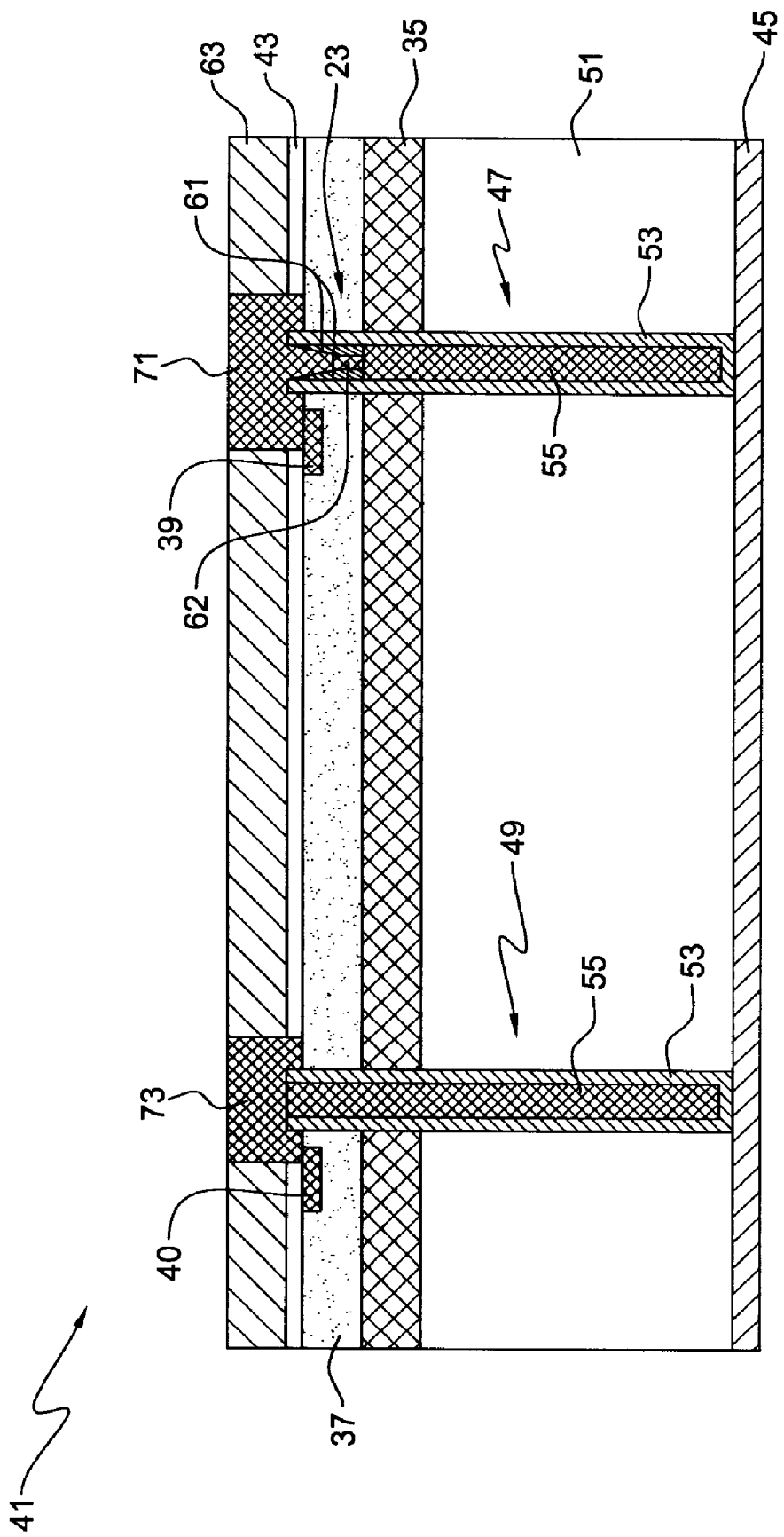
FIG. 8 shows the chip structure of FIG. 7 with contact pads formed in the dielectric openings.

FIGS. 7 and 8 show the steps of forming conductive material in the opening restricted by sidewall spacers 61 and conductive contact pads at the surface of the chip. In FIG. 7, a dielectric layer 63 is deposited on protective layer 43. A layer of resist 65 is then deposited on the dielectric layer and then patterned to form openings 67 and 69 over vias 47 and 49. The openings 67 and 69 are then rendered in dielectric layer 63 and protective layer 43 by etching, for example, by RIE. The RIE process is stopped after etching through all of protective layer 43 so as to expose contacts 39 and 40. The etching process is done selectively so that metal, such as, metal contacts 39 and 40 and via metal 55 is not etched.

Although not shown in the Figures, where the protective layer 43, liner 53 and spacers 61 are the same material, etching may reduce the liner 53 and sidewall spacer 61 to the surface plane of BEOL layer 37. This, however, would not affect the operation of the fuse-type structure. Where the materials, however, are different selective etching could leave these materials in place.

As illustrated in FIG. 8, after removal of layer of resist 65, electrical contact pads 71 and 73 are formed in openings 67 and 69 of dielectric layer 63. This may be achieved by depositing a conformal layer of metal on a chip structure 41 sufficient to fill openings 67 and 69 and, then by chemical-mechanical polishing, remove the metal on the surface of dielectric insulating layer 63 to form contact pads 71 and 73 in recessed openings 67 and 69. Alternatively, a patterned blanket layer of metal may be deposited in openings 67 and 69 to form contact pads 71 and 73 using, for example, the layer of resist 65 to pattern the metal. As shown in FIG. 8, the deposition is such as to make electrical connection to metal contacts 39 and 40. In addition to metal being deposited in recesses 67 and 69, metal is, at the same time, deposited in the narrowed opening or region 62 of recess 60, as restricted by sidewall spacers 61.

Thus, as shown in FIG. 8, the recessed openings 67 and 69 in insulating layer 63 are filled with a metal to form contacts 71 and 73 in the recesses and extend over metal contacts 39 and 40. In addition, metal deposited extends down into the narrowed opening or region 62 restricted by sidewall spacers 61 to make electrical contact with conductive material 55 in TSV 47. As stated above, the metal used preferably corresponds to the same type of metal used in TSVs 47 and 49 and circuit contacts 39 and 40. Thus, where the TSVs and contacts are filled, for example, with any one of Al, Cu, W or Cu doped Al, then the metal selected here to form contacts 71 and 73 would typically be the same material.

Figure 9:
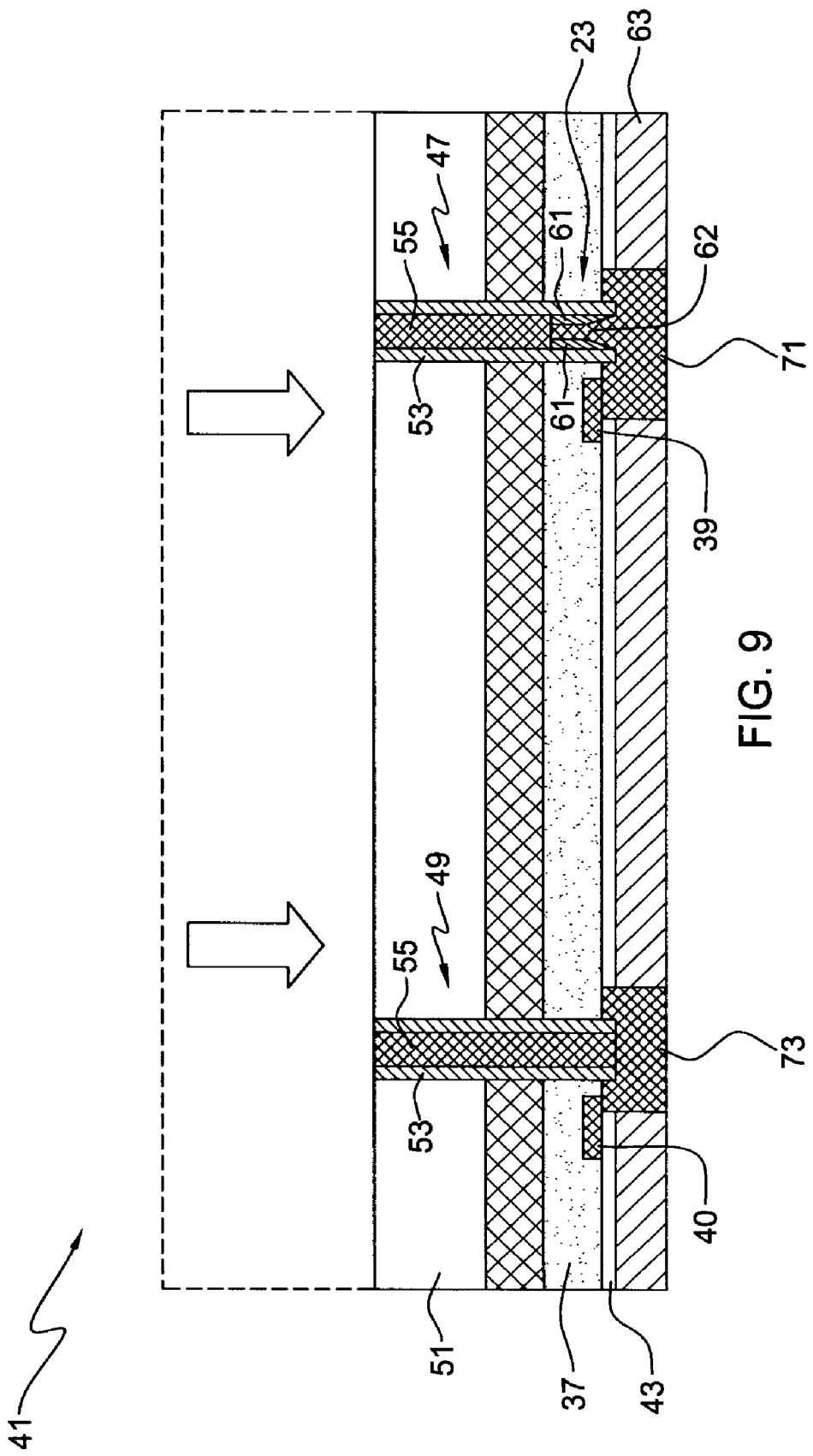
FIG. 9 shows the chip structure of FIG. 8 resulting from wafer thinning from the backside.

As shown in FIG. 9, wafer thinning of silicon 51 from the back side may then be carried out to thin chip structure 41. The TSVs shown in the previous Figures extend to protective layer 45 and, thus, where this is the case, thinning involves removal of protective layer 45 and insulating liner material 53 at the bottom of the TSVs to reveal metal 55 in the TSVs. Where the TSVs extend to less than the thickness of chip layer 51, additional silicon would necessarily be removed to expose the TSV. Typically, after thinning, the chip layer thickness would be in the 20 g to 200 g range. Silicon thinning may also be carried out earlier in the process described to form programmable TSVs. Silicon thinning may be carried out using, for example, backside grinding and/or TMA etch, as depicted by the arrows in FIG. 9.

Figure 10:
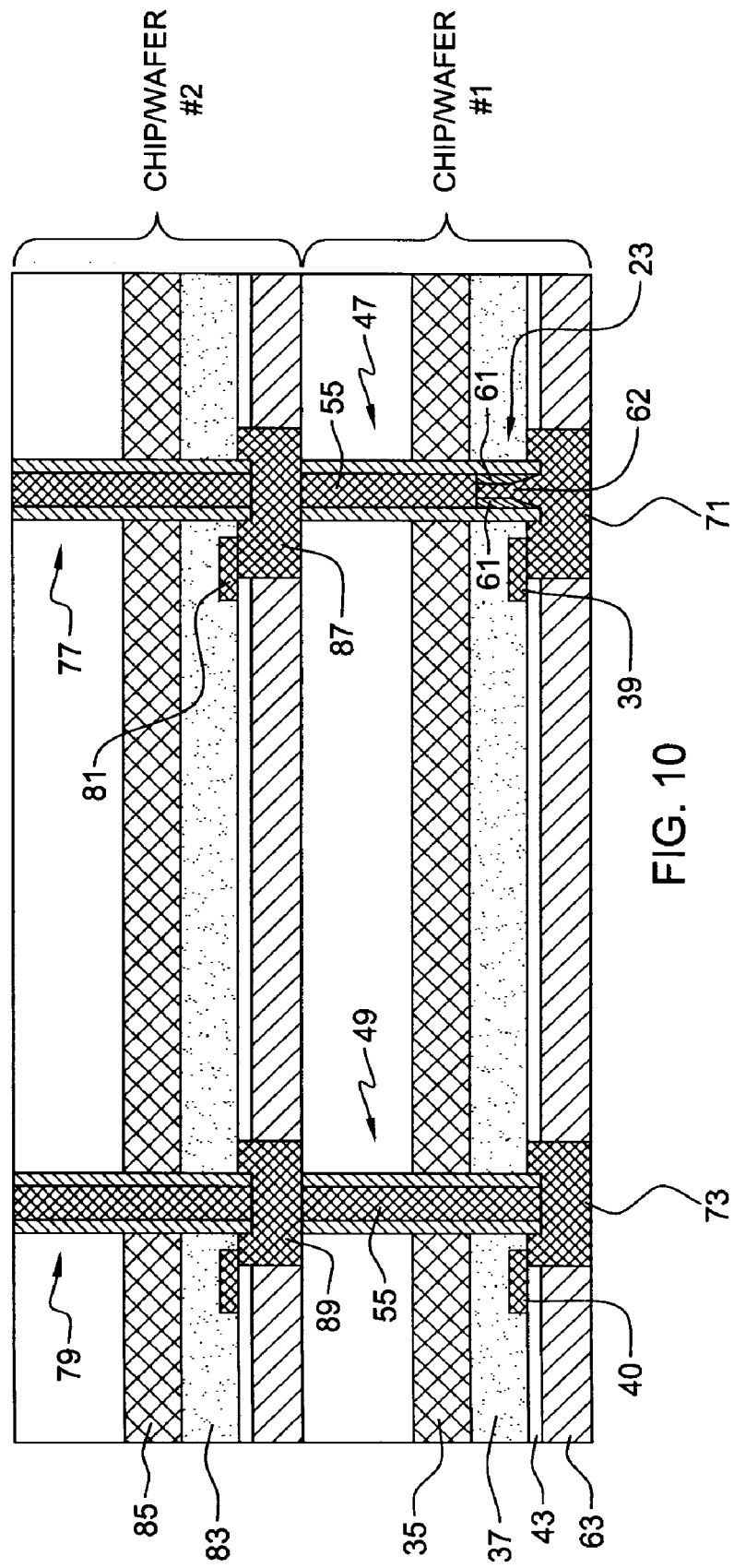
FIG. 10 shows a pair of chips stacked one on another.

After wafer thinning, the resulting chip with fuse-type programmable TSV 47 may be stacked on other chips, with such chips being with or without programmable fuse-type TSVs. FIG. 10 shows two such stacked chips. Chip 1 includes fuse-type programmable TSV 47 and standard, or non-programmable, TSV 49. Chip 2, stacked on chip 1, includes two non-programmable TSVs 77 and 79. Typically, the two chips, with the exception of the steps employed to make the fuse-type structure, would generally use the same materials and fabrication processes.

Chip 2 may be bonded to chip 1 using an adhesive-free approach wherein covalent bonding at room temperature is employed. Alternatively, bonding techniques utilizing adhesive, pressure and/or heat may also be used.

As further shown in FIG. 10, metal contact 81 in BEOL layer 83 connects to programming control circuitry and functional circuitry in FEOL layer 85. Metal contact 81 is also connected to metal contact 87, the latter of which, along with contact 89, may be formed by a damascene process, similar to that used to form metal contacts 71 and 73 in chip 1. As shown, metal contact 87 is bonded to programmable TSV 47. As pointed out earlier, metal contact 39 in chip 1 is connected to both programming control circuitry and functional circuitry in FEOL layer 35. Thus, programming control circuitry is connected to opposing ends of programmable TSV 47.

Again, with reference to FIG. 10, TSV 79 in chip 2 is stacked on TSV 49 in chip 1. Thus, a vertical non-programmable interconnect is made between the two chips. On the other hand, programmable TSV 47 breaks connection between the two chips only when programmed to do so. It is clear that other chips may be stacked on chips 1 and 2 with all of the stacked chips having different combinations of non-programmable and programmable fuse-type TSVs in any number.

FIG. 11 shows the manner in which programmable fuse-type TSV 47 operates when programmed to go from a closed or low impedance state to an open or high impedance state. The programming control circuitry in FEOL layers 35 and 85 in chips 1 and 2 acts to cause electron current to flow into contact 81 in chip 2, through metal contact 87 and into TSV 47 in chip 1 and then through fuse-type structure 23 to contacts 71 and 39, with contact 39 connected to programming control circuitry in chip 1. The current is of sufficient magnitude to cause electromigration in the narrowed opening or neck region 62 and metal contact 71 to cause a void to be created, as shown, near the necking region of sidewall spacers 61. As noted above, the fuse is a bi-directional programmable fuse, which means current may flow in either direction to open the fuse. This void, as shown in FIG. 11, creates an open circuit thus breaking the current path. Although reference is made to spacers 61, it is clear that where the vias are of round cross-section, the spacer 61 would be one continuous spacer around the wall of the round via.

Figure 12A:
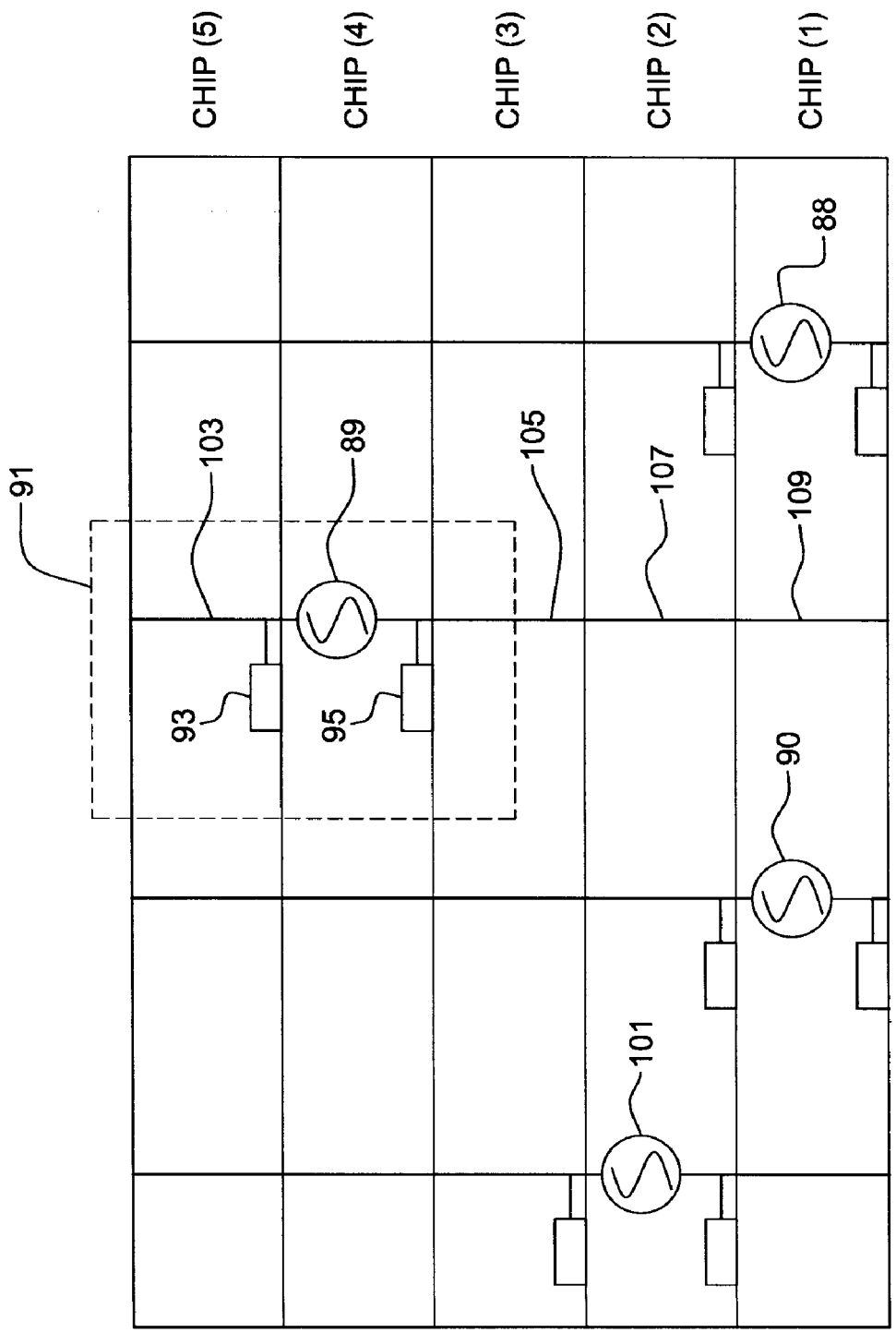
FIG. 12A shows a general view of a chip stack structure with some chips having a programmable fuse-type TSV and non-programmable TSVs.

FIG. 12A shows a general view of a chip stack configuration with at least some chips having programmable and non-programmable fuse-type TSVs. Although a stack of five chips is shown, this is for illustrative purposes only and, as above noted, any combination of chips with programmable and non-programmable fuse-type TSVs is possible. Chip 1, for example, has two fuse-type TSVs shown at 88 and 90. Chip 3, on the other hand, has none, although typically it would. As also noted above, the programming of a TSV is done across a pair of chips with complementary circuitry provided in each chip. Thus, as seen in FIG. 12A, programmable TSV 89 within dotted line block 91, for example, has programming control circuitry 93 in chip 5 and programming control circuitry 95 in chip 4. Similar programming control circuitry schemes are shown for programmable fuse-type TSVs 88, 90 and 101. It is clear that the TSVs 103, 105, 107 and 109 above and below programmable fuse-type TSV 89 are conventional, non-programmable TSVs making a direct connection, as depicted in chips 1, 2 and 3, for example. Similar direct connections are shown in other lines as, for example, the directly connected TSVs above programmable fuse-type TSV 88.

Figure 12B:
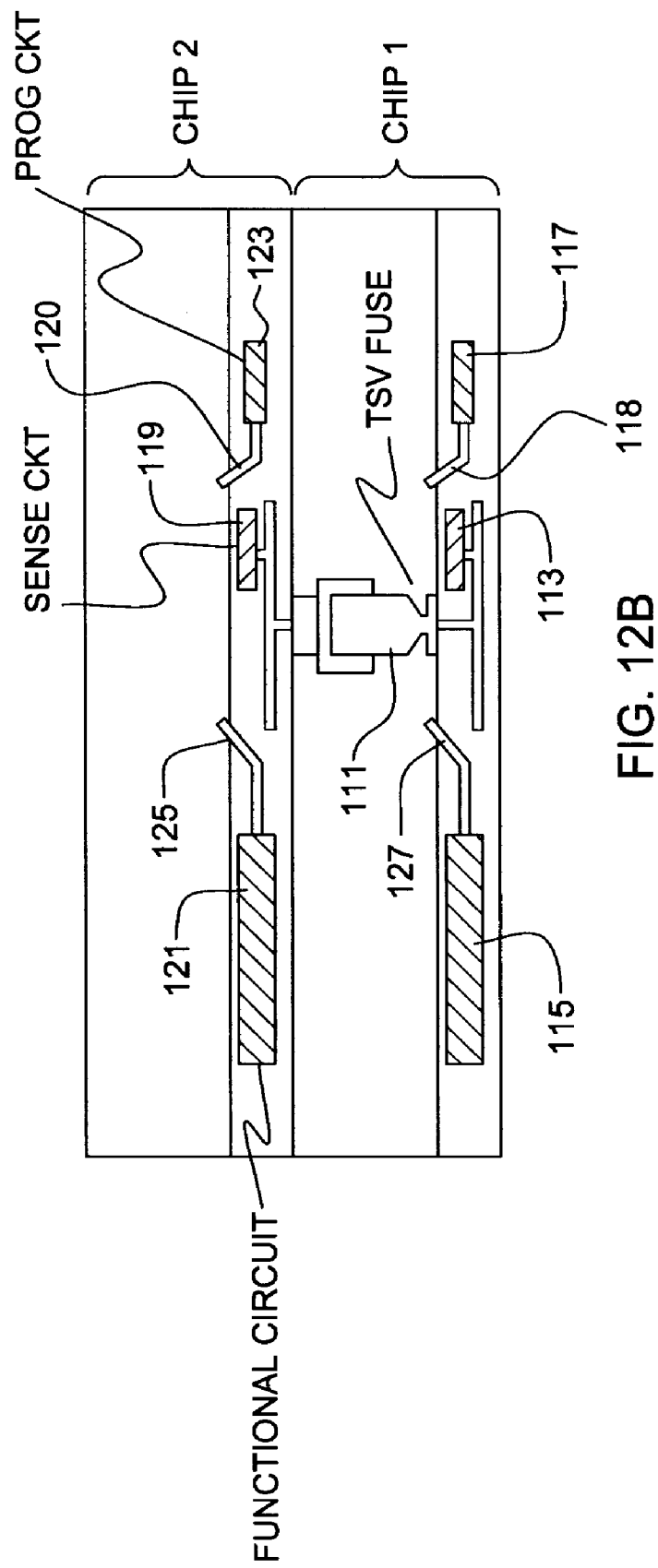
FIG. 12B shows a conceptual diagram of programmable fuse-type TSV and associated components on a pair of stacked chips that may be used to program the fuse-type TSV.

FIG. 12B shows a conceptual schematic of the circuitry arrangement on a pair of stacked chip. Chip 1 includes a programmable TSV fuse 111, sense circuitry 113, functional circuits 115 and programming circuitry 117. Chip 2 includes sense circuitry 119, functional circuitry 121 and programming circuitry 123. Switches 125 and 127 act as isolation switches to isolate the functional circuitry from the programming and sensing circuitry. The programming and sensing circuitry from each chip acts together to program TSV fuse 111. The programming circuitry 117 and 123 acts to cause sufficient current to pass through TSV fuse 111 by closing switches 118 and 120 to thereby cause a non-volatile open circuit path between chip 1 and chip 2 and, thus, acts to program TSV fuse 111. The sensing circuitry acts to determine when TSV fuse 111 is programmed and thus open switches 118 and 120 to disconnect the current source.

Figure 12C:
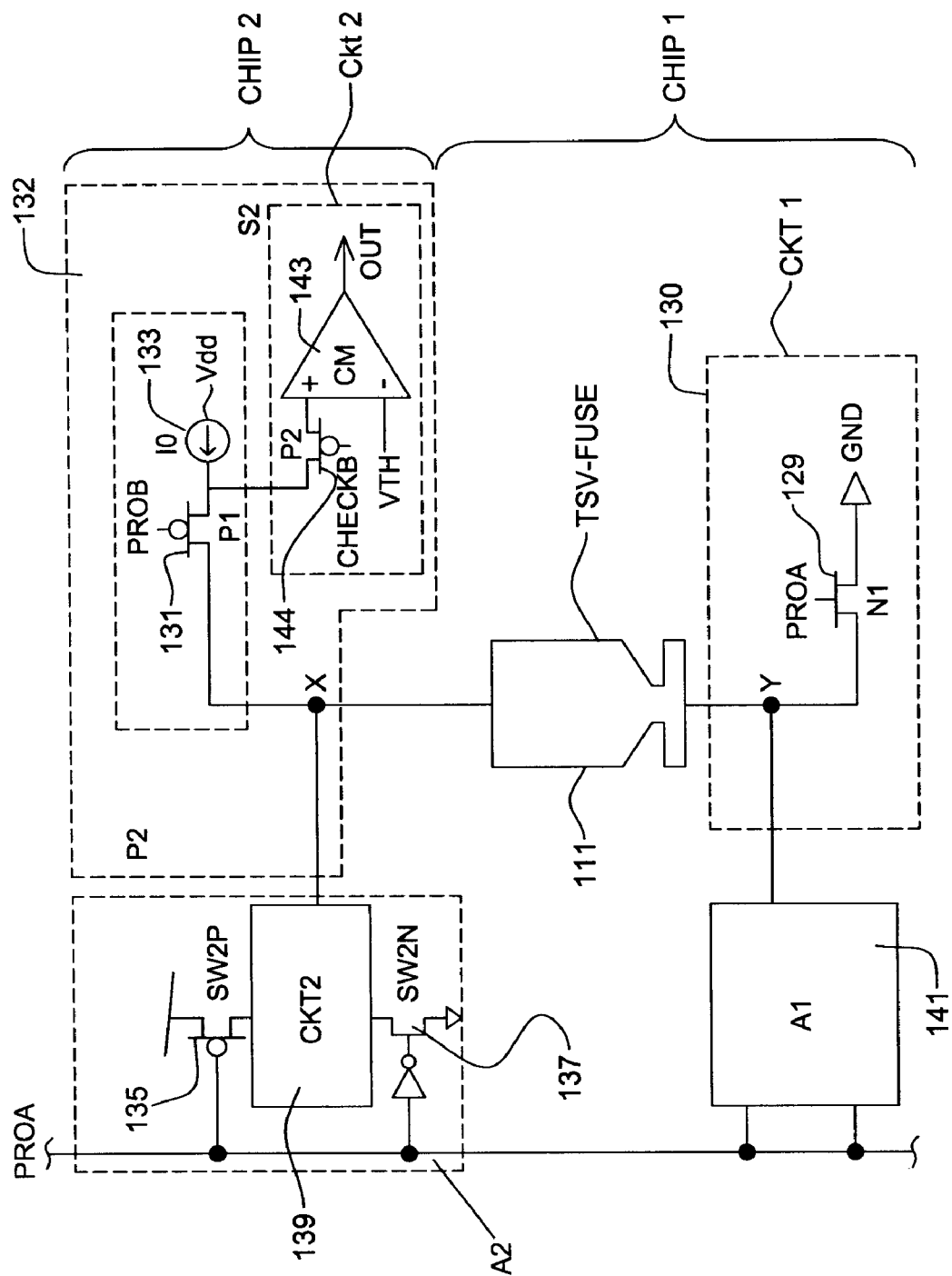
FIG. 12C shows a circuit schematic diagram of fuse programming and control circuitry on a pair of stacked chips that may be used to program the fuse-type TSVs.
Figure 12D:
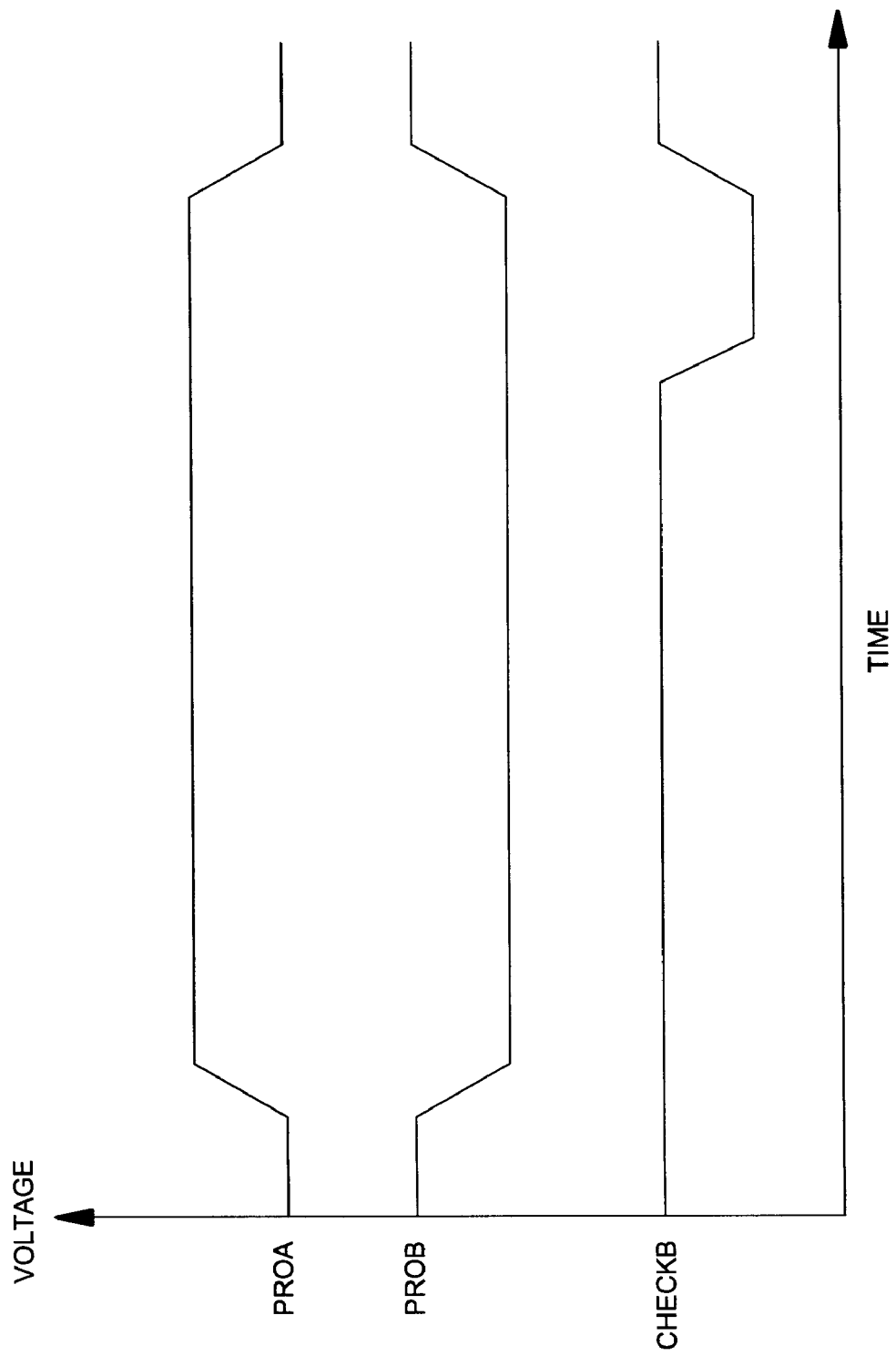
FIG. 12D shows a series of voltage wave forms used to control the operation of the programming and control circuitry of FIG. 12C.

In FIG. 12C, there is shown a more detailed circuitry embodiment for carrying out the programming of a fuse-type TSV across a pair of chips. Programmable TSV fuse 111 in chip 1 is connected between the X node in chip 2 and Y node in chip 1. TSV fuse 111 could be any of the programmable TSVs in FIG. 12A, such as, TSV 88. Complementary programming voltage signals, "PROA" and "PROB", as shown in FIG. 12D of the timing wave form, are applied to respective complementary type switches 129 and 131 within programming blocks 130 and 132. Switch 129 may be an nMOSFET and switch 131 a pMOSFET. These voltages act to open the switches and enable current from current source 133 to pass through TSV fuse 111 to ground.

At the same time, voltage signal "PROA" is applied to complementary p-type switch 135 and n-type switch 137 to isolate the chip 2 functional circuitry 139 from the programming circuitry in block 132. Similar circuitry provided in block 141 acts to isolate the functional circuitry in chip 1 from the programming circuitry in block 130.

When TSV fuse 111 receive sufficient current to cause a void and open circuit, as described with respect to FIG. 11, the voltage level at node X increases and comparator 143 senses the voltage increase at node X when the control signal CHECKB is set to logic low, and provides an output signal of logic high when the voltage at node X exceeds Vth, wherein the Vth is a pre-defined threshold voltage. This operation is carried out by "CHECKB" voltage going to a logic low level pulse, as shown in FIG. 12D. This pulse is applied to the gate electrode of p-type FET 144 to turn it on and connect the voltage level of node X to the positive input of comparator 143. If TSV fuse 111 has been programmed, its resistance is high (e.g. 500 ohms or more) and the voltage at node X is higher than Vth at comparator 143 negative input thereby producing a comparator output signal of logic high indicating the fuse structure 111 has been programmed successfully. As shown in FIG. 12D, when "PROA" signal goes low, "PROB" signal goes high and CHECKB signal goes high, the programming operation is completed.

It is noted that TSV fuse 111 becomes open when the metal in the contact structure, such as contact structure 71 in FIG. 11, electromigrates to cause a void and open circuit. This is a result of a sufficiently high current being applied across the structure. Thus, the complementary programming control circuits in chips 1 and 2 act to apply sufficiently high current to cause an open circuit between the narrowed current path between the TSV fuse sidewall spacers 61 and metal contact 71, as shown in FIG. 11. Although complementary programming control circuitry is described as being apportioned between two chips, it is clear that one portion of the complementary programming control circuitry could exist is one chip along with a fuse-type TSV, and the other portion of such complementary programming control circuitry could exist in electronic apparatus other than a chip.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An electronic package, comprising:
    at least one chip having at least one programmable fuse-type through silicon via structure for chip interconnection to other electronic structure,
    wherein a portion of said programmable fuse-type through silicon via structure has a reduced cross-section of conductive material in the via opening, and wherein said fuse-type structure is programmed from a low impedance state to a high impedance state by control circuitry controlling the current flow through said reduced cross-section of conductive material, and
    wherein during programming operation, said control circuitry controls the current flow level into said reduced cross-section of conductive material in the via opening and senses when said fuse-type structure goes from said low impedance state to said high impedance state.

2. The electronic package as set forth in claim 1 wherein said current flow is controlled by control circuitry formed in each of at least two chips stacked one on another.

3. The electronic package as set forth in claim 2 wherein functional circuits in each of said at least two chips are decoupled by isolation circuits from said control circuitry during programming operation.

4. The electronic package of claim 3 wherein during programming operation, said control circuitry in the other of said at least two chips controls the current flow out of the said reduced cross-section of conductive material in the via opening.

5. An electronic package, comprising:
    a plurality of stacked chips interconnected by through silicon vias at least some of which are programmable by fuse-type structure, wherein said fuse-type structure is a non-volatile structure including a via region of reduced cross-section of conductive material and is programmed from a low impedance value state to a high impedance value state by a sufficient current flow controlled by control circuitry in one chip into said region of reduced cross-section of conductive material and by control circuitry in an adjacent chip out of said region of reduced cross-section of conductive material and wherein a sensing circuit in said control circuitry in said one chip acts to sense when said non-volatile structure is programmed into said high impedance state and thereby disconnects current flow into said region of reduced cross-section of conductive material.

6. The electronic package of claim 5 wherein functional circuits in said one chip and said adjacent chip are isolated from control circuitry during programming control operations.

7. A method of programming a programmable through silicon via interconnecting chips in a chip stack, the method comprising:
    providing at least one through silicon via having a region of reduced cross-section of conductive material;
    supplying current through one chip of the chip stack into one end of said at least one said silicon via having a region of reduced cross-section of conductive material of sufficient level to cause a void in said conductive material to create a high impedance state;

controlling the current out of another end of the said at least one through silicon via having a region of reduced cross-section of conductive material through another chip of said chip stack; and sensing when said at least one through silicon via is programmed into said high impedance state.

8. The method of claim 7, including the further step of isolating functional circuits in at least said one chip and another chip from said steps of supplying current into one end of said at least one through silicon via and controlling the current out of another end of said at least one through silicon via.

* * * * *